United States Patent [19]

Park

[11] Patent Number: 5,621,691

[45] Date of Patent: Apr. 15, 1997

[54] COLUMN REDUNDANCY CIRCUIT AND METHOD OF SEMICONDUCTOR MEMORY DEVICE

[75] Inventor: Churoo Park, Suwon, Rep. of Korea

[73] Assignee: Samsung Electronics Co., Ltd., Suwon, Rep. of Korea

[21] Appl. No.: 518,863

[22] Filed: Aug. 24, 1995

[30] Foreign Application Priority Data

Aug. 25, 1994 [KR] Rep. of Korea .................. 1994-21091

[51] Int. Cl.[6] .............................. G11C 7/00; G11C 8/00; G11C 17/00

[52] U.S. Cl. ................. 365/200; 365/225.7; 365/230.06; 365/96

[58] Field of Search ............................. 365/200, 225.7, 365/230.06, 96

[56] References Cited

U.S. PATENT DOCUMENTS 4,829,480   5/1989   Seo .......................................... 365/200
5,297,085   3/1994   Choi et al. .............................. 365/200
5,325,334   6/1994   Roh et al. ............................... 365/200

Primary Examiner—David C. Nelms
Assistant Examiner—Trong Quang Phan
Attorney, Agent, or Firm—Cushman Darby & Cushman IP Group of Pillsbury Madison & Sutro LLP

[57] ABSTRACT

A column redundancy circuit and method of a semiconductor memory device. The column redundancy circuit comprises a programming element for programming a repair column address; a comparing element for comparing the programmed repair column address with a column address inputted from outside to thereby generate a redundancy enable control signal according to result of the comparison; a decoding element for decoding the repair column address signal to thereby generate a decoding signal; and a redundancy column select element for compounding the decoding signal and a data input signal to thereby enable a redundancy column select signal.

15 Claims, 5 Drawing Sheets

COLUMN REDUNDANCY CIRCUIT AND METHOD OF SEMICONDUCTOR MEMORY DEVICE

BACKGROUND OF THE INVENTION

The present invention relates to a semiconductor memory device, and more particularly to a column redundancy circuit and method of a semiconductor memory device for determining an enable operation of a redundancy column or a normal column under input of a column address.

At present, there are provided in all semiconductor memory devices a redundancy memory cell array and a redundancy circuit for repairing a defective memory cell with a redundancy memory cell. When a redundancy memory cell array is added to a normal memory cell array and an address for designating any one defective memory cell of the normal memory cell arrays is inputted, a redundancy operation is used to select a redundancy row and column connected to the redundancy memory cell by decoding the address inputted. Such an operation is performed by a redundancy decoder. In this case, an output signal of the redundancy circuit for programming the defective address checks whether the normal decoder and the redundancy decoder are enabled or not. As a circuit for programming the defective address, the redundancy circuit programs the defective address by laser cutting according to an address that is input for decoding appropriate fuses included in the redundancy circuit.

The column redundancy circuit determines whether the redundancy column or the normal column is selected or not whenever the column address is inputted. In case that the address designating the defective column address is inputted, the semiconductor memory device is employed to select a redundancy column instead of the defective column.

FIG. 1 is a view showing column redundancy circuit according to a prior art. The column redundancy circuit shown in FIG. 1 is comprised of a controlling circuit 84, a programming part 86, a control signal outputting part 88 for data input fuse, and a redundancy enable control signal outputting part 90. The programming circuit 86 is controlled by an output signal of the controlling circuit 84 and inputs column addresses CAi and $\overline{CAi}$ (i=0~7) to thereby program the column address repaired. The control signal outputting circuit 88 inputs an output signal of the programming circuit 86 and an output signal of a NAND gate 12 of the controlling part 84 and then outputs a control signal φ DFP for data input fuse. And, the redundancy enable control signal outputting part 90 outputs a redundancy enable control signal $\overline{RENi}$ under control of each output signal and a block write signal Φ BW of the programming circuit 86.

The controlling circuit 84 is comprised of a PMOS transistor 2, an NMOS transistor 4, a master fuse MF, an inverter 8, a PMOS transistor 6, an inverter 10, a NAND gate 12, and an inverter 14. The PMOS transistor 2 is connected between the power supply voltage VCC and a node N1 to input a control signal φ CFP to a gate terminal. The NMOS transistor 4 is connected between the node N1 and the ground voltage VSS to input the control signal φ CFP to the gate terminal. The master fuse MF is connected between the node N1 and the NMOS transistor 4 to determine whether the column redundancy circuit is enabled or not. The inverter 8 inputs a signal set at the node N1 and then reverses the signal. The PMOS transistor 6 whose gate terminal is controlled by an output signal of the inverter 6 is connected between the power supply voltage VCC and the node N1.

The inverter 10 inputs an output signal of the inverter 8. The NAND gate 12 inputs an output signal of the inverter 10 and a control signal Φ CFE. And, the inverter 14 inputs an output signal of the NAND gate 12. At the moment, the control signals Φ CFP and φ CFE are generated at logic "high" level through a predetermined logic circuit in synchronization with a row address strobe signal $\overline{RAS}$ before a delay time TRCD ($\overline{RAS}$ to $\overline{CAS}$ delay) required until the column address strobe signal $\overline{CAS}$ is enabled from a time the row address signal strobe signal $\overline{RAS}$ is enabled. Therefore, such control signals Φ CFP and φ CFE are maintained at the logic "low" level in a precharge interval of the row address strobe signal $\overline{RAS}$.

There are provided in the programming circuit 86 a plurality of transmission gates 16, 18, ..., 46 and a plurality of fuses f1, f2, ..., f16. The plurality of transmission gates whose gate terminals are controlled by the NAND gate 12 and the output signal of the inverter 14 of the controlling circuit 84, input the column addresses CAi and $\overline{CAi}$ (i=0~7) to each one terminal. And, the plurality of fuses are connected to the other terminals of the transmission gates, respectively. In such construction, the two fuses f1 and f2 are connected to a node N2 and fused to generate a desired output as described hereafter and the rest of fuse pairs f3, f4, ... f15, f16 are connected to nodes N3, N4, ..., N8, N9, respectively.

The control signal outputting circuit 88 for data input fuse has NMOS transistors 48, 50, ..., 62, and inverters 64 and 66. The NMOS transistors 48, 50, ..., 62 have gate terminals to which the output signals of the NAND gate 12 of the controlling circuit 84 are inputted, drain terminals connected to the nodes N2, N3, ..., N9 of the programming circuit 86, and source terminals connected to the ground voltage VSS. The inverter 64 inputs the output signal of the NAND gate 12 of the controlling circuit 84. The inverter 66 inverts an output signal of the inverter 64 to output a control signal Φ DFP for data input fuse.

There are provided NAND gates 76, 78, 80, 70, 68 and a NOR gate 72 in the redundancy enable control signal outputting circuit 90. The NAND gate 76 inputs signals of the nodes N2, N3, and N4 and the NAND gate 78 inputs signals of the nodes N5 and N6. The NAND gate 80 inputs signals of the nodes N7, N8, and N9 and the NOR gate 72 inputs output signals of the NAND gates 78 and 80. The NAND gate 70 inputs an output signal of the NAND gate 76 and an output signal of the inverter 74 inputting the block write signal Φ BW. And, the NAND gate 68 inputs output signals of the NAND gate 70 and the NOR gate 72 to output the redundancy enable control signal $\overline{RENi}$.

The column redundancy circuit shown in FIG. 1 informs that the master fuse MF of the controlling circuit 84 is cut and repaired. Thereafter, the column redundancy circuit cuts the fuses f1, f2, ..., f16 according to each value of the column addresses CAi and $\overline{CAi}$ inputted, which are connected to the transmission gates 16, 18, ..., 46 of the programming circuit 86. In case that the repaired column address CAi is "10011011", the column address $\overline{CAi}$ is inputted as "01100100" having a complementary logic level against the column address CAi. In this case, the fuse connected to the transmission gate to which the repaired column addresses CAi and $\overline{CAi}$ are inputted as "1", is cut. That is, in case that the repaired column address CAi is "10011011", the column redundancy circuit shown in FIG. 1 cuts the fuses f1, f4, f6, f7, f9, f12, f13, and f15. At this time, any one of the fuses f1, f1, ..., f16 connected to the nodes N2, N3, ..., N9 should be cut.

First of all, the control signals φ CFP and φ CFE are maintained at the logic "low" level in the precharge interval of the row address strobe signal $\overline{RAS}$. In case that the row address strobe signal $\overline{RAS}$ is maintained at the logic "low" level, if the control signal Φ CFP is inputted at the logic "low" level, the PMOS transistor 2 is turned on to set a signal to the node N1 at the logic "high" level. Therefore, a signal set to the logic "high" level and a signal set to the logic "low" level are input to the NAND gate 12, so that a signal set to the logic "high" level is outputted from the NAND gate 12. Thereafter, the signal is outputted at the logic "low" level through the inverter 14 and all the transmission gates 16, 18, . . . , 46 are turned off. Meanwhile, the output signal of the NAND gate 12 is input to the gate terminals of the NMOS transistors 48, 50, . . . , 62 included in the control signal outputting part 88 at the logic "high" level, so that all of the NMOS transistors are turned on.

Again, in case that the row address strobe signal $\overline{RAS}$ is active, the control signal Φ CFP is inputted to the controlling part 84 at the logic "high" level. Thus, the PMOS transistor 2 is turned off. Further, since the PMOS transistor 6 is turned on in the node N1, a signal of the logic "high" level is set. Thereafter, the signal set to the logic "high" level and the control signal Φ CFE set to the logic "high" level are inputted to the NAND gate 12, so that an output signal set to the logic "low" level is outputted from the NAND gate 12. Therefore, the signal is outputted at the logic "high" level through the inverter 14 and all of the transmission gates 16, 18, . . ., 46 are thus turned on. And, the NMOS transistors 48, 50, . . . , 62 included in the control signal outputting part 88 are turned off. The block write signal φ BW inputted to the inverter 74 of the redundancy enable control signal outputting circuit 90 is at the logic "high" level during the block writing. If the block write signal φ BW performs a 8-bits-block write operation, the column addresses CA0 to CA2 perform a "Don't Care" operation. At the time, data DQ0, DQ1, . . . , DQ7 inputted from a data input buffer perform the functions instead of the column addresses CA0 to CA2.

FIG. 2 is a view showing a redundancy column select circuit according to a prior art. The redundancy column select circuit is composed of an inputting circuit 112 for inputting data inputted from the data input buffer and an outputting circuit 114 for generating a redundancy column select signal RCSL. There are provided in the inputting part 112 NMOS transistors NT1, NT2, . . . , NT8 and a PMOS transistor 92. One terminal of each of the NMOS transistors NT1, NT2, . . . , NT8 is connected to the data DQ0, DQ1, . . . , DQ7 and the other terminal thereof is each connected to the fuses f17, f18, . . . , 124. Further, gate terminals of the NMOS transistors are connected to the power supply voltage VCC. The PMOS transistor 92 whose gate terminal is connected to an output signal of an inverter 110 is connected between the power supply voltage VCC and a node N10, the inverter 110 inputting the signal Φ DFP.

Also, there are provided in the outputting circuit 114 an inverter 96, a PMOS transistor 94, a NAND gate 98, a NAND gate 100, an inverter 104, a NAND gate 106, and an inverter 108. The inverter 96 reverses a signal set at the node N10. The PMOS transistor 94 whose gate terminal is controlled by the inverter 96 is connected between the power supply voltage VCC and the node N10. The NAND gate 98 inputs the block write signal φ BW and the output signal of the inverter 96. The NAND gate 100 inputs an output signal of the NAND gate 98 and an output signal of the inverter 102 inputting the redundancy enable control signal $\overline{RENi}$. The inverter 104 reverses an output signal of the NAND gate 100. The NAND gate 106 inputs an output signal of the inverter 104 and control signals Φ YE and φ CP. And, the inverter 108 inputs an output signal of the NAND gate 106 to generate the redundancy column select signal RCSL.

As shown in FIG. 2, there are provided in the inputting circuit 112 NMOS transistors NT1, NT2, . . . , NT8 and a PMOS transistor 92. One terminal of each of the NMOS transistors NT1, NT2, . . . , NT8 is connected to the data DQ0, DQ1, . . . , DQ7 and the other terminal thereof is each connected to the fuses f17, f18, . . . , f24. Further, gate terminals of the NMOS transistors are connected to the power supply voltage VCC. The PMOS transistor 92 whose gate terminal is connected to an output signal of an inverter 110 is connected between the power supply voltage VCC and the node N10, the inverter 110 inputting the signal Φ DFP. Such a construction is employed to connect the data input fuses f17, f18, . . . , f24 in order to code the redundancy column select signal RCSL. Thereafter, it is possible to code the redundancy column select signal RCSL under use of any one data selected by cutting all of the data input fuses except the one data input fuse corresponding to the data of interest. At the moment, the control signals φ CP and φ YE function as important signals determining a time the redundancy column select signal RCSL is enabled. That is, the control signal Φ YE is developed as a value of cell data on a bit line to thereby inform that the redundancy column select signal will be enabled. Also, the other control signal φ CP enables the redundancy column select signal after going by a predetermined time from the time the column address CAi was received.

As mentioned above, the conventional column redundancy circuit, as shown in FIG. 1, should cut any one of the fuses connected to the nodes N2, N3, . . ., N9 to thereby use it. Accordingly, there should be provided double fuse, except the master fuse MF, in comparison with the number of column addresses used in decoding the column. That is, in case that one fuse corresponding to the column address CAi is cut, it is not necessary to cut the other fuse corresponding to the other column address $\overline{CAi}$. Therefore, this means that the fuses should be more used than the number of fuses required in obtaining information to be desired. This results in increasing the total dimension of a chip and making a process difficult in that the fuse is selectively cut.

Further, as shown in FIG. 2, in case that the data input fuse is used to control a block write function to be generally used in a graphic memory, there arises an outstanding increase in the number of fuses because the column redundancy circuit shown in FIG. 1 does not memorize various uses for the column address for enabling the redundancy column select signal RCSL. Also, in the prior art, there arises a problem in that the dimension of the chip is increased due to use of the data input fuse. Therefore, a desirable method is to input data to the data input buffer without using the data input fuse, thereby coding the redundancy column select signal.

SUMMARY OF THE INVENTION

It is an object of the invention to provide a column redundancy circuit and method of a semiconductor memory device suitable to a high integration memory device, which is capable of reducing total dimension of a chip by minimizing the number of fuses.

It is another object of the invention to provide a column redundancy circuit and method of a semiconductor memory device capable of making a process easy under provision with one fuse per column address.

It is yet object of the invention to provide a column redundancy circuit and method of a semiconductor memory device capable of improving operable speed by directly inputting data from a data input buffer after eliminating a data input fuse and by coding a redundancy column select signal.

In order to achieve these objects, there is provided in the present invention a semiconductor memory device having a column redundancy circuit which programs and stores a repair column address, compares the repair column address externally with a column address inputted, decodes the repair column address, and generates a column redundancy enable signal corresponding to data inputted from a data input buffer according to result of the decoding operation.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

Figure 1:
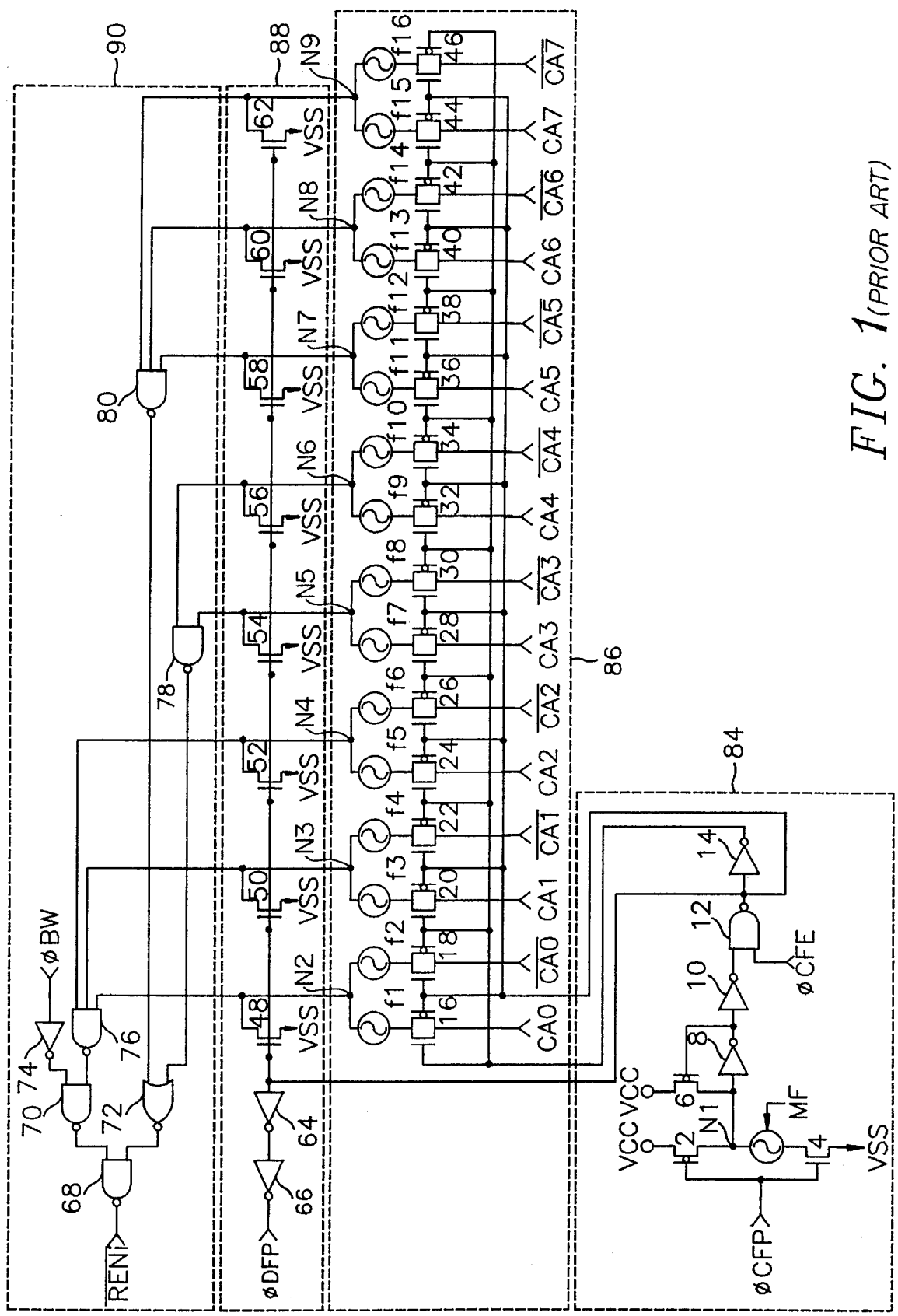
FIG. 1 is a view illustrating a column redundancy circuit according to a prior art.
Figure 2:
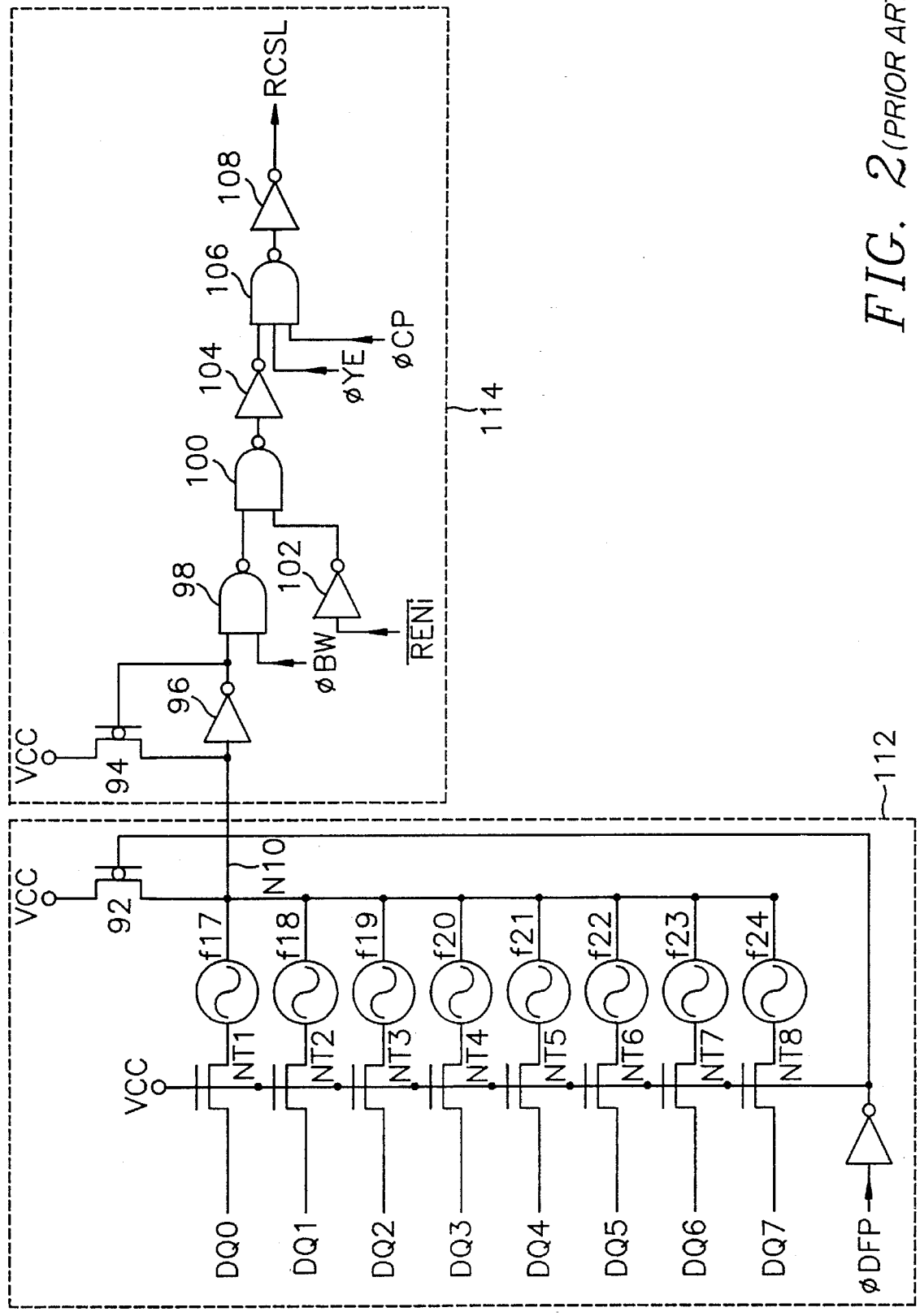
FIG. 2 is a view illustrating a redundancy column select circuit according to FIG. 1.
Figure 3A:
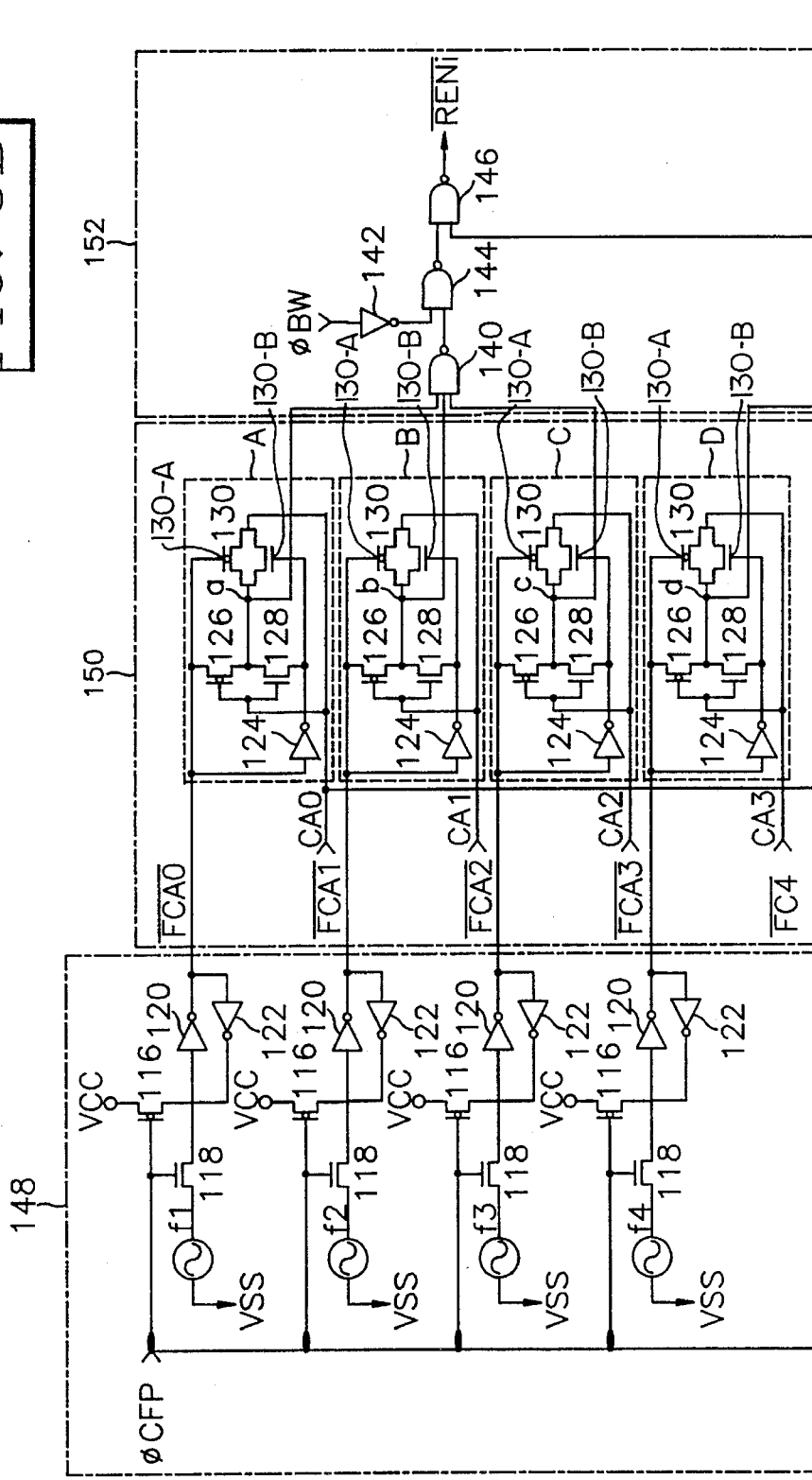
FIGS. 3A and 3B are complementary views illustrating a column redundancy circuit according to the present invention.
Figure 3B:
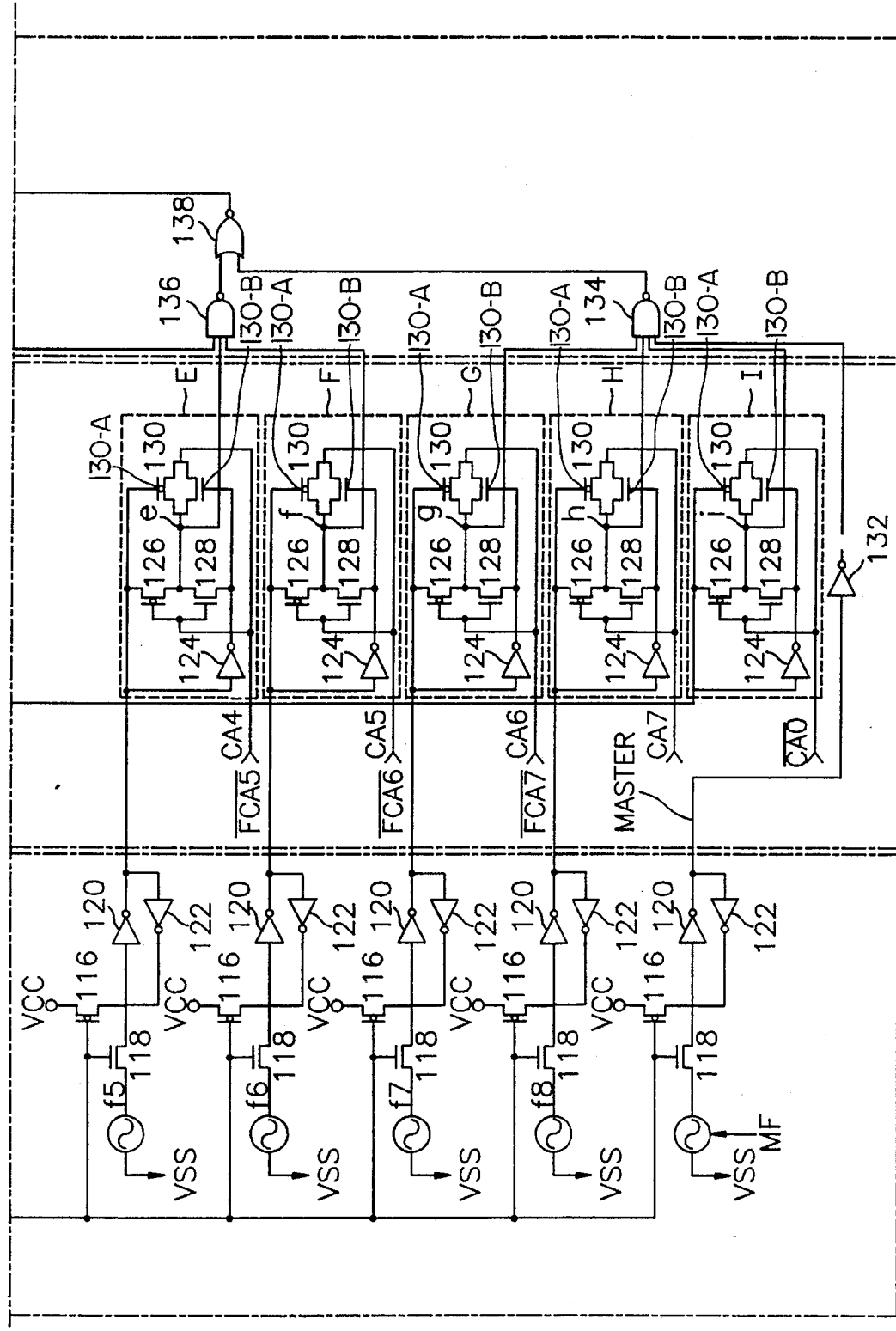

FIGS. 3A and 3B are complementary views illustrating a column redundancy circuit according to the present invention. The column redundancy circuit shown in FIGS. 3A and 3B is comprised of a programming circuit 148, a comparing part 150, and an outputting circuit 152. The programming circuit 148 programs a repaired column address. The comparing circuit 150 compares the repaired column address $\overline{FCAi}$ (i=0~7) with a column address externally inputted. And, the outputting circuit 152 logically compounds output signals from the comparing circuit 150 to generate a redundancy enable control signal $\overline{RENi}$.

There are provided in the programming circuit 148 a plurality of PMOS transistors 116, a plurality of NMOS transistors 118, and a plurality of inverters 120 and 122. The PMOS transistors 116 have source terminals connected to the power supply voltage VCC and gate terminals commonly connected to a control signal Φ CFP. The NMOS transistors 118 have gate terminals connected to the control signal Φ CFP and a channel whose one terminal is connected to a fuse "f" coupled between the ground voltage VSS, and whose the other terminal is connected to a drain terminal of the PMOS. Each of the plurality of inverter 120 and 122 are formed to latch-connect to each other and to the other terminal of the channel of the NMOS transistor 118 so that each repaired column address bit becomes stored in a portion of a register during operation. When the master fuse MF is cut, this indicates that a repair operation is completed.

The comparing circuit 150 is composed of a plurality of comparison circuits A, B, . . . , I, of which constructions each of are the same. For example, the comparison circuit A is composed of a PMOS transistor 126 and an NMOS transistor 128 which are connected between the column address $\overline{FCA0}$ and an output signal of the inverter 124 inputting the repaired column address $\overline{FCA0}$ and also have each gate terminal connected to the column address CA0. Further, the comparison circuit A has a transmission gate 130 consisting of a PMOS transistor 132 and an NMOS transistor 134, which have a common channel whose one terminal is connected to a node "a" and whose the other terminal is connected to the column address CA0 and also have gate terminals each connected to the repaired column address $\overline{FCA0}$ outputted from the programming part 148 and the output signal of the inverter 124.

There are provided in the comparison circuit I the PMOS transistor 126, the NMOS transistor 128, and the transmission gate 130. The PMOS transistor 126 and the NMOS transistor 128 are connected between the column address CA0 and the output signal of the inverter 124 inputting the column address CA0, and have gate terminals connected to the column address $\overline{CA0}$, respectively. The transmission gate 130 is composed of a PMOS transistor and an NMOS transistor which have a common channel whose one terminal is connected to a node "i" and whose the other terminal is connected to the column address $\overline{CA0}$ and also have gate terminals each connected to the column address CA0 and the output signal of the inverter 124.

The outputting circuit 152 has a NAND gate 140 for inputting signals set at nodes a, b, and c; an inverter 142 for inputting the block write signal Φ BW; a NAND gate 144 for inputting an output signal of the inverter 142 and an output signal of the NAND gate 140; a NAND gate 136 for inputting signals set at nodes d, e, and f of the comparison circuits D, E, and F; a NAND gate 134 for inputting an output signal of the inverter 132 inputting signals set at nodes g, h, and i of the comparison circuits G, H, and I and a master signal MASTER; a NOR gate 138 for inputting output signals of the NAND gates 134 and 136; and a NAND gate 146 for inputting output signals of the NAND gate 144 and the NOR gate 138 and outputting the redundancy enable control signal $\overline{RENi}$.

Programming of the column redundancy circuit shown in FIGS. 3A and 3B cuts and repairs the master fuse MF of the programming circuit 148. Then, the fuses f1, f2, . . . , f8 are cut according to values of the column address CAi inputted. For example, if the repair column address is "10011011", a program operation is completed by cutting of the fuses f1, f3, f4, f6, and f7 corresponding to the address "1".

The programming circuit 148 of the redundancy circuit according to the present invention only uses the number of fuses corresponding to quantity of information to be programmed. However, in the prior art, twice the number of fuses, except the master fuse MF, when considering with the number of column addresses used in decoding the column, were required. As a result, the present invention improves integration of the semiconductor memory device.

In operation, the control signal Φ CFP is maintained at the logic "low" level during the precharge interval of the row address strobe signal $\overline{RAS}$. When the row address strobe signal $\overline{RAS}$ is maintained at the logic "low" level in its precharge interval, if the control signal ɸ CFP is inputted at the logic "low" level, the PMOS transistor 116 is turned on and the repair column address $\overline{FCAi}$ (i=0~7) set to the logic "high" level and the master control signal MASTER are reset at the logic "low" level.

If the row address strobe signal $\overline{RAS}$ is active, the control signal Φ CFP is inputted at the logic "high" level before the column address CAi is inputted. Thus, the PMOS transistor 116 is turned off and the NMOS transistor is turned on. For example, the repair column addresses $\overline{FCAi}$ (i=0, 2, 3, 5, and 6) are generated at the logic "low" level through the cut fuses f1, f3, f4, f6, and f7 and the repair column addresses $\overline{FCAi}$ (i=1, 4, and 7) are generated at the logic "high" level through the fuses f2, f5, and f8 which are not cut. The master control signal MASTER is generated at the logic "low" level through the master fuse MF.

The repair column address $\overline{FCAi}$ generated from the programming circuit 148 is inputted to the comparing circuit 150. If the column address CAi is inputted from outside, the comparing circuit 150 compares the repair column address $\overline{FCAi}$ with the column address CAi. In this case, if the repair column address $\overline{FCA0}$ and the column address CA0 are the same to each other at the logic "low" level, an output signal is generated at the logic "low" level through the comparison circuit A. On the other hand, if the repair column address $\overline{FCA1}$ and the column address CA1 are the same to each other at the logic "high" level, an output signal set to the logic "high" level is generated at the logic "high" level through the comparison circuit B. The other comparison circuits perform this comparison operation as well.

Since an exclusive OR function is performed by the comparison circuits, if the repair column address $\overline{FCAi}$ and the column address CAi are the same, a redundancy select line is enabled under such a state that the redundancy enable control signal $\overline{RENi}$ is set at the logic "low" level. Further, the redundancy enable control signal $\overline{RENi}$ disables a normal column select line. The master control signal MASTER is generated at the logic "low" level according to whether the master fuse MF is cut or not, if generated, the column redundancy circuit shown in FIGS. 3A and 3B exclusively ORs the repair column address $\overline{FCAi}$ and the column address CAi to thereby determine whether the redundancy column select signal RCSL or the normal column select signal is enabled.

Meanwhile, the comparison circuit I, as shown in FIGS. 3A and 3B, performs the following function. That is, after repair, the repair column address $\overline{FCAi}$ and the master control signal MASTER enter a stand-by state in order to be compared with the column address externally inputted. However, in a real operation, the comparison operation is performed as soon as the master control signal MASTER is changed to the logic "low" level. This means that the redundancy enable control signal $\overline{RENi}$ can be changed to the logic "high" level or the logic "low" level. Therefore, in order to guarantee efficiency of the column address CAi compared with the repair column address $\overline{FCAi}$, the column addresses CA0 and $\overline{CA0}$ are exclusively ORed to each other. Further, since the column addresses CA0 and $\overline{CA0}$ are set at the logic "low" level before an effective input, the redundancy enable control signal $\overline{RENi}$ is always maintained at the logic "high" level. Thereafter, if the column addresses CA0 and $\overline{CA0}$ are changed to the logic "high" and "low" levels, or the logic "low" and "high" levels, respectively, an output signal of the comparison circuit I comes to be at the logic "low" level, so that the redundancy enable control signal $\overline{RENi}$ is changed to the logic "low" level or the logic "high" level according to the result of the comparison of the rest of comparison circuits.

The block write signal φ BW inputted to the inverter 142 of the outputting circuit 152 comes to be at the logic "high" level during a block write operation. Thus, a block write signal φ BW initiates a block write operation and the column addresses CA0 to CA2 function as "Don't Care". The data DQ0, DQ1, . . . , DQ7 inputted from the data input buffer perform the function instead of the column addresses CA0 to CA2. The details relating to the above will be explained hereinafter.

Figure 4:
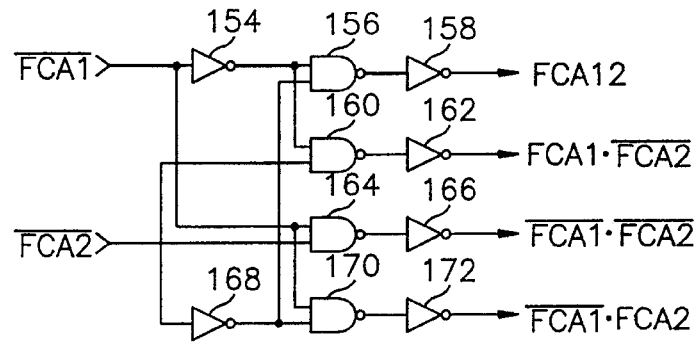
FIG. 4 is a view illustrating a decoding circuit of a repair column address according to the present invention.

FIG. 4 is a view showing a decoding circuit of the repair column address. The decoding circuit shown in FIG. 4 inputs the repair column address signals $\overline{FCA1}$ and $\overline{FCA2}$ and generates decoding signals FCA12, FCA1·$\overline{FCA2}$, $\overline{FCA1}$·FCA2, and $\overline{FCA1·FCA2}$ by using the logic gates shown therein. Further, the decoding circuit of FIG. 4 comprises an inverter 154 inputting the repair column address signal $\overline{FCA1}$; an inverter 168 inputting the repair column address signal $\overline{FCA2}$; a NAND gate 156 inputting output signals of the inverters 154 and 168; a NAND gate 160 inputting an output signal of the inverter 154 and the repair column address $\overline{FCA2}$; a NAND gate 164 inputting the repair column address signals $\overline{FCA1}$ and FCA2a NAND gate 170 inputting the repair column address signal $\overline{FCA1}$ and an output signal of the inverter 168; an inverter 158 inputting an output signal of the NAND gate 156 and outputting the decoding signal FCA12; an inverter 162 inputting an output signal of the NAND gate 160 and outputting the decoding signal FCA1·$\overline{FCA2}$; an inverter 166 inputting an output signal of the NAND gate 164 and outputting the decoding signal $\overline{FCA1}$·FCA2; and an inverter 172 inputting an output signal of the NAND gate 170 and outputting the decoding signal $\overline{FCA1·FCA2}$.

Figure 5:
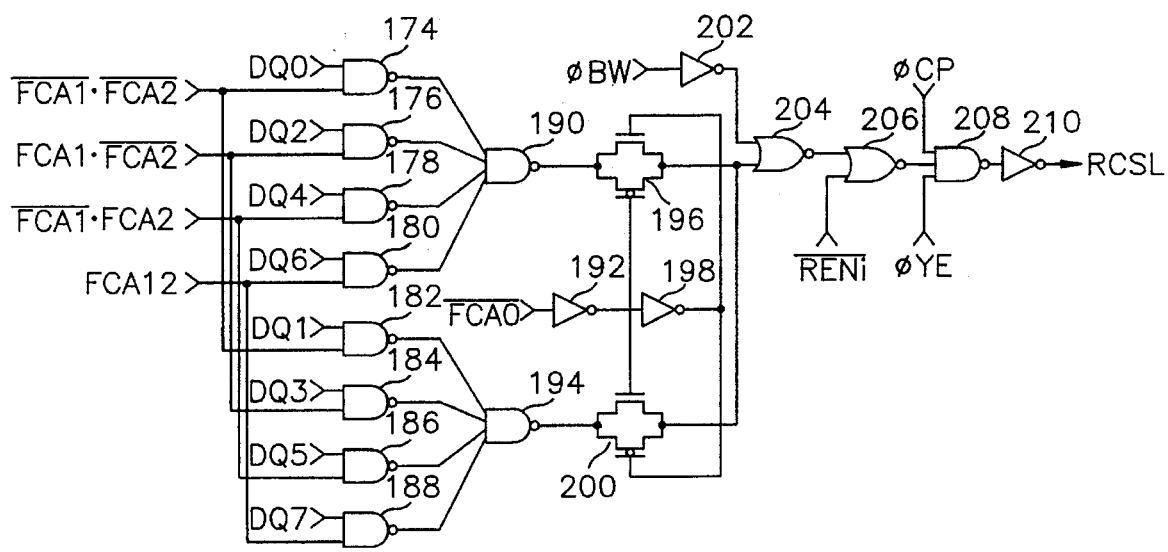
FIG. 5 is a view illustrating a redundancy column select circuit according to the present invention.

FIG. 5 is a view showing the redundancy column select circuit according to the present invention. The redundancy column select circuit of FIG. 5 comprises a NAND gate 174 inputting the decoding signal $\overline{FCA1·FCA2}$ and the data DQ0; a NAND gate 176 inputting the decoding signal FCA1·$\overline{FCA2}$ and the data DQ2; a NAND gate 178 inputting the decoding signal $\overline{FCA1}$·FCA2 and the data DQ4; a NAND gate 180 inputting the decoding signal FCA12 and the data DQ6; a NAND gate 182 inputting the decoding signal $\overline{FCA1·FCA2}$; a NAND gate 184 inputting the decoding signal FCA1·$\overline{FCA2}$ and the data DQ3; a NAND gate 186 inputting the decoding signal $\overline{FCA1}$·FCA2 and the data DQ5; and a NAND gate 188 inputting the decoding signal FCA12 and the data DQ7. Further, there are provided in the redundancy column select circuit of FIG. 5 a NAND gate 190 inputting the output signals of the NAND gates 174, 176, 178, and 180; a NAND gate 194 inputting the NAND gates 182, 184, 186, and 188; an inverter 192 inputting the repair column address $\overline{FCA0}$; an inverter 198 inputting an output signal of the inverter 192; and transmission gates 196 and 200 inputting output signals of the NAND gates 190 and 194 and having gate terminals to which output signals of the inverters 192 and 198 are inputted. Furthermore, there are provided in the redundancy column select circuit of FIG. 5 a NOR gate 204 connected to the other terminal of the transmission gates 196 and 200 in order to input an output signal of the inverter 202 inputting the block write signal φ BW; a NOR gate 206 inputting an output signal of the NOR gate 204 and the redundancy enable control signal $\overline{RENi}$; a NAND gate 208 inputting an output signal of the NOR gate 206 and the output signals φ CP and φYE; and an inverter 210 inputting an output signal of the NAND gate 208 and generating the redundancy column select signal RCSL.

Operation of the column redundancy circuit according to the present invention will be explained with respect to FIGS. 4 and 5. When the same data is written in a plurality of memory cells, the block write function temporarily writes data by simultaneously enabling the column select lines connected to each memory cell. As mentioned above, when the block write signal φ BW is at the logic "high" level and if the redundancy column select signal RCSL is enabled, it is possible to determine column addresses CA3 to CA7, but not the column addresses CA0 to CA2.

As discussed above, in case of the block write operation, redundancy column select signal RCSL is initiated by any one of the data DQ0–DQ7. However, in a operation that is not a block in its operation the corresponding redundancy column signal RCSL is initiated according to the logic levels of the column addresses CA0, CA1, and CA2.

|      | Column address |     |     |
| ---- | --- | --- | --- |
| Data | CA0 | CA1 | CA2 |
| DQ0  | 0   | 0   | 0   |
| DQ1  | 0   | 0   | 1   |
| DQ2  | 0   | 1   | 0   |
| DQ3  | 0   | 1   | 1   |
| DQ4  | 1   | 0   | 0   |
| DQ5  | 1   | 1   | 0   |
| DQ6  | 1   | 1   | 1   |

The column redundancy circuit according to the conventional art processes the column redundancy by means of one fuse and cuts the rest of fuses. However, in the column redundancy circuit according to the present invention, it is possible to enable redundancy column select signal RCSL by using only the column address after decoding the programmed column address thus eliminating a conventional data input fuse. That is, in a block write operation, if the column address signal and the repair column address signal are at the same level, since the column redundancy select signal is enabled, it is possible to know whether the redundancy column select signal can be initiated by input of any one data by means of the decoding signal of the repair column address. The decoding circuit of FIG. 4 decodes the repair column addresses $\overline{FCA1}$ and $\overline{FCA2}$. After decoding the repair column addresses $\overline{FCA1}$ and $\overline{FCA2}$, the redundancy column select circuit of FIG. 5 enables the redundancy column select signal RCSL by using the repair column address $\overline{FCA0}$ when the block write signal $\Phi$ BW is at the logic "high" level and when the redundancy enable control signal $\overline{RENi}$ is at the logic "low" level by means of any one of the data DQ0–DQ7. The control signals $\phi$ CP and $\Phi$ YE, like the prior art, function as important signals determining a time the redundancy column select signal RCSL is enabled. That is, the control signal $\Phi$ YE is developed as a value of cell data on a bit line to thereby inform that the redundancy column select signal will be enabled. Also, the other control signal $\Phi$ CP enables the redundancy column select signal after a predetermined time from the time the column address CAi was received.

As mentioned above, it is well known to one skilled in the art that the scope of the technique of the present invention is effectively applied to the column redundancy circuit. And, various modifications may be without departing from the spirit or scope of the general inventive concept as defined by the appended claims and their equivalents. For example, even if the circuit mentioned above is not used, other than logic gate can be used in the construction of the comparing part so as to perform the exclusive OR operation. Furthermore, although the addresses CA0, CA1, and CA2 corresponding to LSB (Least Significant Bit) are used as the column address controlled by the block write control signal, there can be provided same efficiency in the present invention.

As mentioned in the foregoing description, in accordance with the column redundancy circuit and method of the present invention, it is possible to reduce the total dimension of the chip by minimizing the number of fuses and is also possible to facilitate the process according to the cutting of one fuse which is provided to one column address. Further, according to the present invention, there is provided efficiency in that the operable speed of the redundancy column select signal can be improved by a direct input to the data input buffer under such a situation that the data input fuse is eliminated.

What is claimed is:

1. A semiconductor memory device that provides for substituting a normal memory cell with a defective memory cell, comprising:

a column redundancy circuit including a program circuit that programs and stores a plurality of repair column address in a register, a comparison circuit that compares said repair column address stored in said register with a column address externally input, a decoder that operates to decode said repair column address and obtain decoded signals, and a redundancy column select circuit that operates in a block select mode to generate a column redundancy enable signal corresponding to data input from a data input buffer and said decoded signals.

2. The semiconductor memory device as claimed in claim 1, wherein said repair column address is compared with said column address externally input using an exclusive OR logic circuit.

3. The semiconductor memory device as claimed in claim 2, wherein said exclusive OR logic circuit includes a plurality of exclusive OR gates each having an inverter and 4 transistors that each exclusively OR one bit of said repair column address with a respective bit of said externally input column address.

4. The semiconductor memory device as claimed in claim 1, wherein said repair column address stored in said register is used by said register to obtain said decoded signals before said column address is externally input.

5. A column redundancy circuit of a semiconductor memory device that provides for substituting a normal memory cell for a defective memory cell, comprising:

programming means for programming a repair column address;

comparing means for comparing said repair column address with an externally input column address to thereby generate a redundancy enable control signal according to this comparison;

decoding means for decoding said repair column address signal to generate a decoding signal; and redundancy column select means for operating on said decoding signal and a data input signal in a block select mode to enable a redundancy column select signal.

6. The column redundancy circuit as claimed in claim 5, wherein said programming means comprises a plurality of fuses that are cut according to said repair column address, and a master fuse that indicates a repair operation is complete.

7. The column redundancy circuit as claimed in claim 5, wherein said comparing means inputs said column address and said repair column address to exclusively OR corresponding bits of said column address and said repair column address with an exclusive OR logic circuit.

8. The column redundancy circuit as claimed in claim 7, wherein said exclusive OR logic circuit includes a plurality of exclusive OR gates each having an inverter and 4 transistors that each exclusively OR one bit of said repair column address with a respective bit of said externally input column address.

9. The column redundancy circuit as claimed in claim 5, wherein said repair column address stored in said register is used by said register to obtain said decoded signals before said column address is externally input.

10. The column redundancy circuit according to claim 5 further including means for storing said programmed repair column address and wherein said comparing means compares a stored repair column address with said externally input column address.

11. A column redundancy method that provides for substituting a normal memory cell for a defective memory cell, said method comprising the steps of:

programming a repair column address;

storing said programmed repair column address in said register;

comparing said stored repair column address with an externally input column address input and generating a redundancy enable control signal according to this;

decoding said repair column address signal and generating a decoding signal; and operating on said decoding signal and a data input signal in a block select mode to enable a redundancy column select signal.

12. The column redundancy method as claimed in claim 11, wherein said programming step comprises a first step of cutting a plurality of fuses according to said repair column address, and a second step of cutting a master fuse indicating that a repair operation is complete.

13. The column redundancy method as claimed in claim 11, wherein said comparing step inputs said column address and said repair column address and exclusively ORs corresponding bits of said column address and said repair column address.

14. The column redundancy method as claimed in claim 13, wherein said exclusive OR is performed at a bit level with an exclusive OR logic circuit that includes an inverter and 4 transistors for each bit.

15. The column redundancy method as claimed in claim 11, wherein said repair column address stored in said register is used by said register to obtain said decoded signals before said column address is externally input.

* * * * *